United States Patent [19]

Ryan et al.

[11] Patent Number: 4,527,254
[45] Date of Patent: Jul. 2, 1985

[54] DYNAMIC RANDOM ACCESS MEMORY HAVING SEPARATED $V_{DD}$ PADS FOR IMPROVED BURN-IN

[75] Inventors: Charles T. Ryan, Poughkeepsie, N.Y.; Roy E. Scheuerlein, Burlington, Vt.; Lucian A. Kasprzak, Hopewell Junction, N.Y.

[73] Assignee: International Business Machines Corporation, Armonk, N.Y.

[21] Appl. No.: 441,709

[22] Filed: Nov. 15, 1982

[51] Int. Cl.³ .................................. G11C 13/00
[52] U.S. Cl. .................................. 365/51; 365/201; 365/230; 371/21
[58] Field of Search .............. 371/8, 10, 11, 21; 365/51, 230, 200, 201

[56] References Cited

U.S. PATENT DOCUMENTS 3,702,466 11/1972 Nakagiri et al. ................ 365/51
4,371,963 2/1983 Edwards, Jr. et al. ........... 371/51
4,464,754 8/1984 Stewart et al. ................... 371/51

Primary Examiner—Terrell W. Fears
Attorney, Agent, or Firm—Sughrue, Mion, Zinn, Macpeak, and Seas

[57] ABSTRACT

A random access memory, a method of manufacturing a random access memory, and a method of testing a random access memory in which separate operating voltage terminal pads are provided for the memory cell arrays and peripheral circuits of the memory. By providing separate operating voltage terminal pads, different operating voltages can be applied to the array of cells and the peripheral circuits during a burn-in procedure. In this manner, the burn-in procedure is greatly accelerated without danger of damage to the peripheral circuits due to exceeding the sustaining voltages of the transistor devices of the peripheral circuits during burn-in.

8 Claims, 4 Drawing Figures

DYNAMIC RANDOM ACCESS MEMORY HAVING SEPARATED $V_{DD}$ PADS FOR IMPROVED BURN-IN

BACKGROUND OF THE INVENTION

The invention pertains to the manufacture and testing of semiconductor integrated circuits. More particularly, the invention pertains to the manufacture and testing of dynamic random access memories.

In order to reduce the failure rate of integrated circuits while in actual operation, it is desirable that each circuit be put through a burn-in procedure prior to the use of the circuit in operating electronic equipment. The simplest way to conduct the burn-in procedure is to connect the integrated circuit to power supply sources of the intended ratings of the circuits in a test circuit while, for instance, clocking predetermined test data in and out of the memory. However, such a burn-in procedure is not efficient because only a relatively small proportion of potential failures will show up within a reasonable burn-in time of, for example, one hour or less.

In order to accelerate the burn-in procedure, it is well known to conduct the procedure at an elevated temperature. This does increase the number of failures which show up during a procedure of reasonable length. However, there are limits on the temperature of the device above which irreparable damage is done to the device.

Another known technique for accelerating the number of defective devices which can be detected during a burn-in procedure is to increase the operating voltages applied to the circuit. Such a technique, known as voltage stressing, is described in Intel Corporation Reliability Report RR-7, September 1975. As indicated by the graph of FIG. 3 thereof, the failure rate of a batch of dynamic random access memories in a burn-in procedure can be dramatically increased by increasing the applied operating voltage. If, for example, the applied operating voltage is increased to one and one-half to two times the normal operating voltage, the failure rate during the burn-in procedure can be more than doubled.

Although the above-described conventional method of increasing the operating voltage can be used for many types of devices, as the cell size of a random access memory is decreased, increasing the operating voltage tends to destroy devices which are "good" devices and which should not show up as failures during the burn-in procedure. For instance, in a 4K dynamic random access memory using four micron photolithography, it is possible to apply a $V_{DD}$ operating voltage in the range of one and one-half to two times the normal $V_{DD}$ level without damage to the device. However, for a 64K memory in which two micron photolithography is utilized, increasing $V_{DD}$ above one and one-half times the normal level will damage many otherwise normal devices. The reason for this is that the reduced size of the transistor devices used in the memory reduces the sustaining voltages of the devices above which junction damage or drain-to-gate oxide shorting occurs.

Hence, it is an object of the present invention to provide a dynamic random access memory which can be put through a burn-in procedure in a relatively short period of time, while yet it is possible to detect a large portion of defective devices during the burn-in procedure.

It is a further object of the invention to provide such a random access memory having a small cell size which is capable of sustaining an elevated operating voltage during a burn-in procedure without damage to transistor devices of the memory.

Still further, it is an object of the invention to provide a burn-in method for random access memories having a small cell size with which a large portion of defective devices can be detected within a reasonable test time without damaging normal devices.

SUMMARY OF THE INVENTION

These, as well as other objects of the invention, are met a random access memory having on the memory chip separate $V_{DD}$ (primary operating voltage) terminal pads for the peripheral (control) circuits of the memory and for the storage pad array. During the burn-in procedure, a normal or slightly elevated value of $V_{DD}$ is applied to the $V_{DD}$ terminal pad for the peripheral circuits, while an operating voltage of one and one-half to two or more times the normal $V_{DD}$ level is applied to the storage pad array $V_{DD}$ terminal pad. In this manner, because most of the failures of a dynamic random access memory are caused by electrode shorting in the storage pad array, most of the defective devices can be detected in a burn-in procedure within a relatively short period of time. At the conclusion of the burn-in procedure, the two $V_{DD}$ terminal pads are interconnected and the chip is packaged.

Further, the invention provides a burn-in method for random access memories including the steps of applying a normal operating voltage to peripheral circuits of the memory while simultaneously applying an elevated operating voltage of one and one-half to two or more times the normal operating voltage to the storage pad array. After defective devices have been eliminated, the two $V_{DD}$ pads are interconnected prior to or during packaging. The circuit can then be operated as normal random access memory circuit.

DESCRIPTION OF THE PREFERRED EMBODIMENTS

Figure 1:
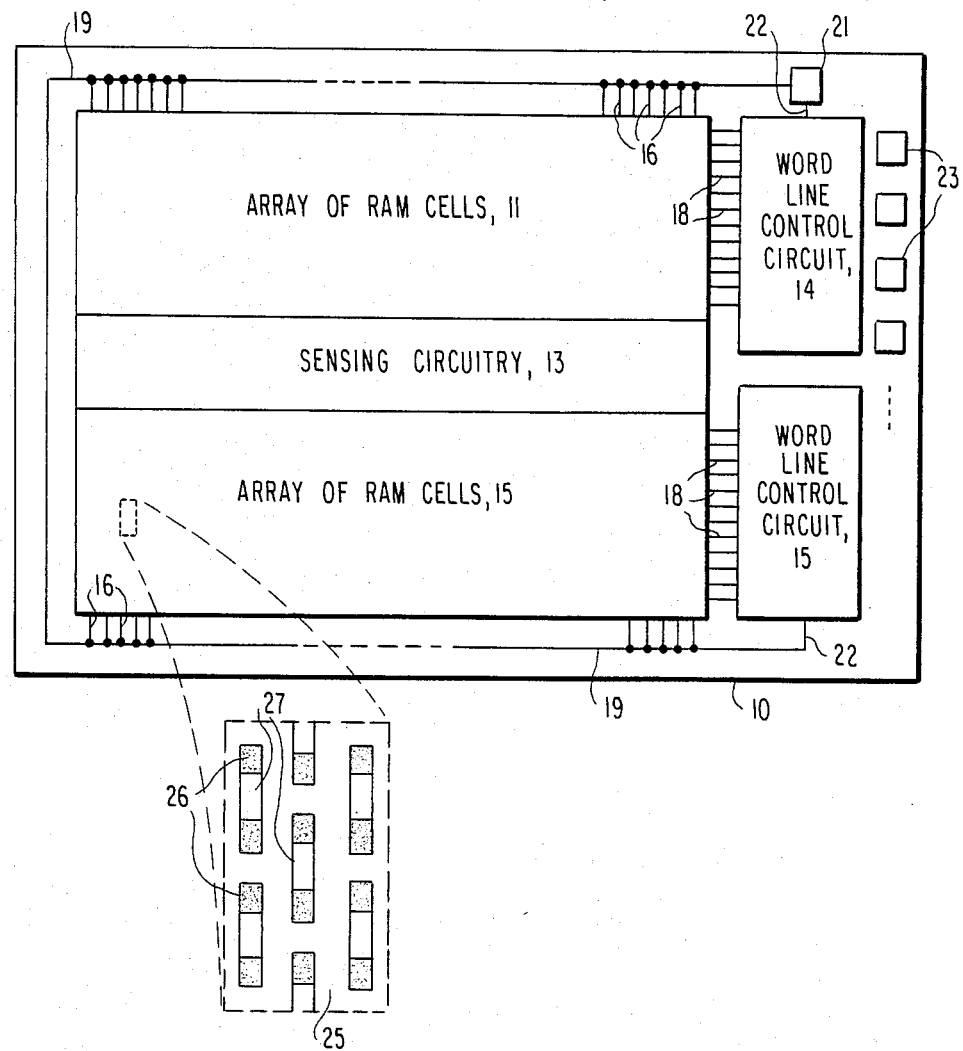
FIG. 1 is a top view showing the arrangement of a conventional random access memory of a type to which the invention is applied.

Referring first to FIG. 1, there is shown therein the basic arrangement of a random access memory chip. The memory includes two arrays 11, 12 of memory cells disposed on opposite sides of sensing circuitry 13. Bit line conductors (not shown) extend from the sensing circuitry 13 across both arrays 11, 12 of memory cells. Peripheral circuitry composed of word line control circuits 14, 15 is disposed at ends of corresponding arrays of cells 11, 12. Word lines 18 extend from the control circuits 14, 15 through the arrays 11, 12 of memory cells perpendicular to the bit lines.

Figure 2:
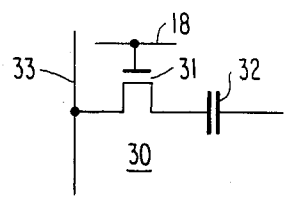
FIG. 2 is a schematic diagram of a single memory cell of the memory illustrated in FIG. 1.

Referring momentarily to FIG. 2, a schematic diagram of a single cell of one of the arrays 11, 12 of cells is shown. The cell includes a transistor 31 having a drain connected to a bit line 33 and a gate connected to a respective one of the word lines 18. The source of the transistor 31 is coupled to one of the plates of the cell storage capacitor 32. With reference back to FIG. 1, and specifically to the enlarged portion at the left of the Figure, the other plate of the capacitor 32 is electrically integral with a conductive layer 25 formed, for instance, of polysilicon material, which extends down sloped sides 26 of holes 27. One hole 27 is necessary to form each cell in the arrays. In this arrangement, the second plates of each storage capacitor of all cells are interconnected through the conductive layer 25.

It is to be further noted that other techniques are available for interconnecting the second plates of these storage capacitors. For instance, it is possible to interconnect the second plates of the storage capacitors using conductive strips which run parallel to the bit lines or conductive strips running parallel to the word lines. In the peripheral area to the side of the arrays 11, 12 of memory cells, large numbers of connectors 16 join the conductive layer 25 (or conductive strips if that technique is utilized) to a bus 19. The bus 19 extends to a $V_{DD}$ terminal pad 21. In the conventional arrangement illustrated in FIG. 1, the word line control circuits (peripheral circuits) 14, 15 are also connected directly to the terminal pad 21, as shown here through lines 22. Additional terminal pads 23 are provided for inputs-/output and control connections.

In this conventional arrangement, the operating voltage which is applied to the storage cells is unavoidably the same as that applied to the peripheral circuits. Therefore, if the sustaining voltage of the transistors which make up the peripheral circuits is lowered due to a reduction in photolithographic dimensions (as is necessary to increase the storage capacity of the memory), the voltage which can be applied during a burn-in procedure to accelerate the procedure is severely limited.

Figure 3:
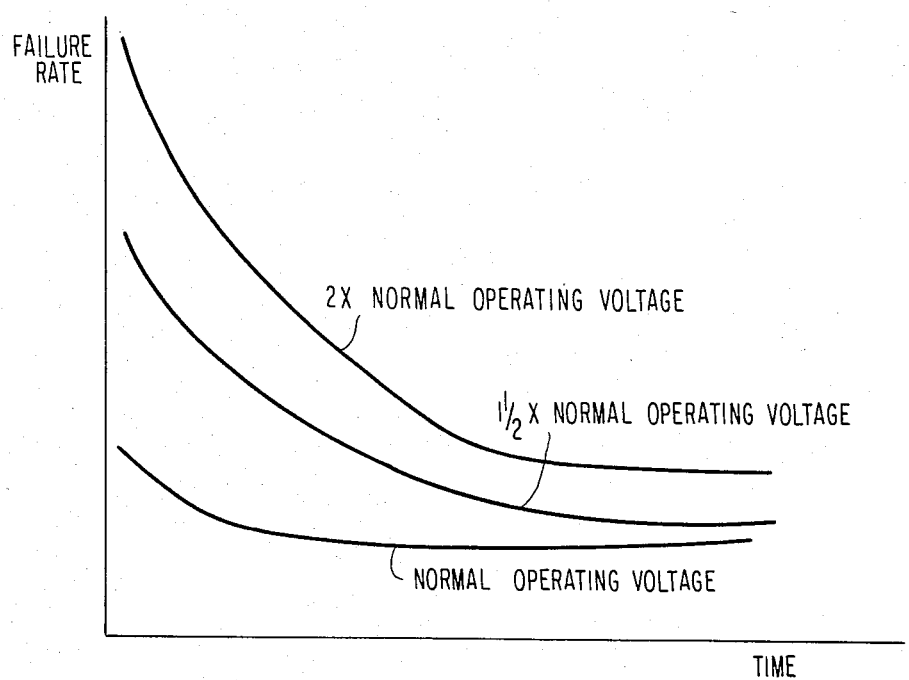
FIG. 3 is a graph plotting failure rate versus time with applied operating voltage as a parameter.
Figure 4:
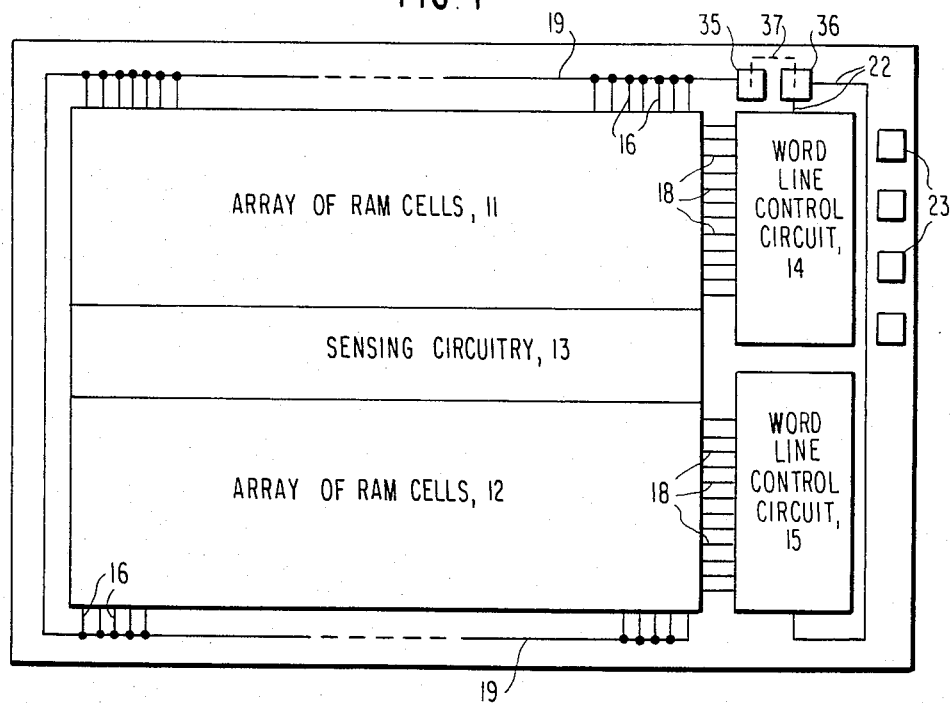
FIG. 4 is a top view showing the arrangement of a random access memory constructed in accordance with the teachings of the present invention.

Referring now to FIG. 4, the arrangement of a random access memory constructed in accordance with the invention will be described. Unlike the conventional device illustrated in FIG. 3, the random access memory of the invention is provided with two $V_{DD}$ terminal pads 35, 36. The terminal pad 35 is connected through the bus 19 and the connectors 16 to the conductive layer 25. The second terminal pad 36, which in the chip as originally fabricated is electrically isolated from the terminal pad 35, is connected through the lines 22 to supply the operating voltage to the word line control circuits 14, 15.

During the burin-in procedure, a normal or near-normal operating voltage can be applied through the terminal pad 36 to the word line control circuits 14, 15, while an operating voltage of one and one-half to two times or more the normal operating voltage can be applied to the storage capacitors of the memory cells using the terminal pad 35. The higher operating voltage which can be applied to the storage capacitor array greatly accelerates the burn-in procedure while, due to the fact that a normal or near-normal voltage is applied to the word line control circuits 14, 15, there is no danger that normal devices will be damaged during the burn-in procedure.

After the burn-in procedure has been completed and the chip is to be packaged, the terminal pads 35 and 36 are electrically connected, for instance, via a jumper 37 shown in phantom in FIG. 4. The interconnected terminal pads 35 and 36 are then connected to the single $V_{DD}$ pin of the package. If desired, a single bonding lead may be used to interconnect both the terminal pads 35, 36 and the $V_{DD}$ pin of the package.

This completes the description of the preferred embodiments of the invention. Although preferred embodiments have been described, numerous modifications and alterations are believed apparent to one of ordinary skill in the art without departing from the spirit and scope of the invention.

We claim:

1. A random access memory having at least one array of memory cells and peripheral circuits associated with said at least one array of memory cells, wherein the improvement comprises electrically isolated operating voltage terminal pads being provided for said at least one array of memory cells and said peripheral circuits.

2. The random access memory of claim 1, wherein the improvement further comprises means for electrically interconnecting said operating voltage terminal pads following burn-in processing of said random access memory.

3. The random access memory of claim 2, wherein each memory cell of said at least one array of memory cells comprises a storage capacitor, and wherein the improvement further comprises the operating voltage terminal pad for said at least one array of memory cells being connected to one plate of said storage capacitor of each of said memory cells.

4. A memory circuit comprising:
peripheral circuit devices;
a memory voltage terminal pad for electrically connecting said peripheral circuit devices to a low voltage source;
an array of charge storage devices;
a charge storage device voltage terminal pad for electrically connecting said array of charge storage devices to a high voltage source; and
means for selectively electrically connecting said memory voltage, terminal pad to said storage device voltage terminal pad;
whereby said array of charged storage devices can be tested at a high operating voltage without damaging said peripheral circuit devices, and may be operated at a low voltage subsequent to high voltage testing.

5. The random access memory of claim 3, each memory cell further comprises a transistor having its source coupled to a second plate of said storage capacitor.

6. The random access memory of claim 5 further comprising word lines extending from said peripheral circuits through said array and a gate of said transistor connected to said word line.

7. The random access memory of claim 3 wherein each memory cell comprises an aperture having sloped walls formed in an electrically conductive layer and said one plate of said storage capacitor is formed on said sloped wall.

8. The random access memory of claim 7 wherein each memory cell comprises a storage capacitor having one plate formed on sloped aperture walls in said electrically conductive layer, said walls defining holes associated with each cell wherein said one plates are all interconnected through said electrically conductive layer.

* * * * *